United States Patent
Shen et al.

(10) Patent No.: US 11,732,352 B2
(45) Date of Patent: Aug. 22, 2023

(54) HYDROGEN FREE SILICON DIOXIDE

(71) Applicant: Applied Materials, Inc., Santa Clara, CA (US)

(72) Inventors: Zeqing Shen, San Jose, CA (US); Bo Qi, San Jose, CA (US); Abhijit Basu Mallick, Palo Alto, CA (US); Nitin K. Ingle, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 17/173,871

(22) Filed: Feb. 11, 2021

(65) Prior Publication Data

US 2021/0254210 A1 Aug. 19, 2021

Related U.S. Application Data

(60) Provisional application No. 62/978,314, filed on Feb. 19, 2020.

(51) Int. Cl.
*C23C 16/40* (2006.01)
*C23C 16/52* (2006.01)

(52) U.S. Cl.
CPC ............ *C23C 16/402* (2013.01); *C23C 16/52* (2013.01)

(58) Field of Classification Search
None
See application file for complete search history.

(56) References Cited

U.S. PATENT DOCUMENTS

| | | |
|---|---|---|
| 7,498,273 B2 | 3/2009 | Mallick et al. |
| 7,964,514 B2 | 6/2011 | Chua |
| 8,440,571 B2 | 5/2013 | Weidman et al. |
| 9,230,800 B2 | 1/2016 | Lavoie et al. |
| 2015/0287593 A1 | 10/2015 | Canaperi et al. |

FOREIGN PATENT DOCUMENTS

KR   101762978 B1   7/2017

OTHER PUBLICATIONS

PCT International Search Report and Written Opinion in PCT/US2021/017639 dated Jun. 17, 2021, 10 pages.
Zohni, Omar, et al., "Investigating thin film stresses in stacked silicon dioxide/silicon nitride structures and quantifying their effects on frequency response", J. Micromech. Microeng. 17 (2007) 1042-1051.

*Primary Examiner* — Joel G Horning
(74) *Attorney, Agent, or Firm* — Servilla Whitney LLC

(57) ABSTRACT

Hydrogen free (low-H) silicon dioxide layers are disclosed. Some embodiments provide methods for forming low-H layers using hydrogen-free silicon precursors and hydrogen-free oxygen sources. Some embodiments provide methods for tuning the stress profile of low-H silicon dioxide films. Further, some embodiments of the disclosure provide oxide-nitride stacks which exhibit reduced stack bow after anneal.

8 Claims, No Drawings

HYDROGEN FREE SILICON DIOXIDE

CROSS-REFERENCE TO RELATED APPLICATIONS

This application claims priority to U.S. Provisional Application No. 62/978,314, filed Feb. 19, 2020, the entire disclosure of which is hereby incorporated by reference herein.

TECHNICAL FIELD

Embodiments of the present disclosure generally relate to methods of depositing silicon dioxide films comprising little to no hydrogen.

BACKGROUND

Silicon dioxide is widely used in the semiconductor industry. Yet many of the known methods for producing silicon dioxide films produce films with high concentrations of hydrogen. There are few, if any, known methods for depositing silicon dioxide films with little to hydrogen.

Further, the processes for depositing silicon dioxide films with less hydrogen produce films with poorer film qualities, including breakdown voltage and/or wet etch rate.

Accordingly, there is a need for methods of depositing silicon dioxide films with little to hydrogen as well as methods which provide films with suitable breakdown voltage and wet etch rate.

SUMMARY

One or more embodiments of the disclosure are directed to a method of forming a low-H silicon dioxide layer. The method comprises exposing a substrate to a hydrogen-free silicon precursor comprising $Si(NCS)_4$, a hydrogen-free oxygen source, and a plasma to form a low-H silicon dioxide layer. The low-H silicon dioxide layer has less than or equal to about 3 percent hydrogen on an atomic basis.

Additional embodiments of the disclosure are directed to a method of tuning a stress profile of a low-H silicon dioxide layer. The method comprises exposing a substrate in a processing chamber to a hydrogen-free silicon precursor comprising $Si(NCS)_4$, a hydrogen-free oxygen source, and a plasma to form a low-H silicon dioxide layer. One or more of a flow rate of the hydrogen-free oxygen source or a pressure of the processing chamber is modified to tune the stress profile of the low-H silicon dioxide layer during an anneal process.

Further embodiments of the disclosure are directed to an oxide-nitride stack comprising alternating layers of silicon nitride and low-H silicon dioxide. The silicon nitride layers having a positive delta stress value and the low-H silicon dioxide layers have a negative delta stress value.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

Embodiments of the present disclosure relate to silyl pseudohalides and uses thereof for the deposition of silicon dioxide layers containing little to no hydrogen (low-H silicon dioxide layers). Some embodiments of the disclosure relate to silyl psedohalides, specifically $Si(NCS)_4$. Some embodiments of the disclosure relate to methods for depositing low-H silicon dioxide layers with superior properties to silicon dioxide layers deposited with other silicon precursors or by other methods. Some embodiments of the disclosure As used in this regard, a "low-H silicon dioxide layer" is a term to denote films or layers which comprise silicon and oxygen in approximately a 1:2 ratio. Further, a "low-H silicon dioxide layer" contains little to no oxygen. As used in this regard, a layer or film with "little to no oxygen" comprises less than or equal to about 5 atomic percent, less than or equal to about 3 atomic percent, less than or equal to about 1 atomic percent or less than or equal to about 0.5 atomic percent of hydrogen. For the purposes of this disclosure and the appended claims, "low-H silicon dioxide layers" may also be referred to as "hydrogen free silicon dioxide".

Some embodiments of the disclosure begin by depositing a silicon dioxide layer on a substrate. The low-H silicon dioxide layer is deposited by exposing a substrate to a hydrogen-free silicon precursor, a hydrogen-free oxygen source and a plasma formed from a plasma gas within a processing chamber. In some embodiments, the hydrogen-free silicon precursor, the hydrogen-free oxygen source and the plasma are all exposed to the substrate simultaneously. Stated differently, the operation may be referred to as a plasma-enhanced chemical vapor deposition (PECVD) process. In some embodiments, one or more of the hydrogen-free silicon precursor, the hydrogen-free oxygen source and the plasma may be co-flowed into a processing chamber together.

The hydrogen-free silicon precursor may be any suitable silicon precursor which does not contain hydrogen. As used in this regard a "hydrogen-free" silicon precursor or oxygen source comprises less than or equal to about 5 percent, less than or equal to about 2 percent or less than or equal to about 1 percent hydrogen on an atomic count basis.

In some embodiments, the hydrogen-free silicon precursor comprises a species with the general formula $SiX_4$, where each X is a pseudohalogen group. In some embodiments, each X is the same pseudohalogen group. In some embodiments, each pseudohalogen group is independently selected from nitrile (—CN), cyanate (—OCN), isocyanate (—NCO), thiocyanate (—SCN), isothiocyanate (—NCS), selenocyanate (—SeCN) and isoselenocyanate (—NCSe). For the avoidance of doubt, the atom closest to the dash (-) is the atom bonded to the silicon atom.

In some embodiments, the hydrogen-free silicon precursor comprises a isothiocyanate (—NCS) group. In some embodiments, the hydrogen-free silicon precursor comprises or consists essentially of $Si(NCS)_4$. For the avoidance of doubt, $Si(NCS)_4$ has four isothiocyanate groups with each nitrogen atom bonded to a central silicon atom. As used in this regard, a hydrogen-free silicon precursor which "consists essentially of $Si(NCS)_4$" comprises greater than or equal to about 98 percent, greater than or equal to about 99 percent or greater than or equal to about 99.5 percent of $Si(NCS)_4$ on a molar basis, excluding any inert carrier or diluent gases.

The hydrogen-free oxygen source may be any suitable oxygenating agent which does not contain hydrogen. In some embodiments, the hydrogen-free oxygen source comprises one or more of $O_2$, $O_3$ or $N_2O$.

In some embodiments, the hydrogen-free oxygen source comprises or consists essentially of $O_2$. As used in this regard, a hydrogen-free oxygen source which "consists essentially of $O_2$" comprises greater than or equal to about 98 percent, greater than or equal to about 99 percent or greater than or equal to about 99.5 percent of $O_2$ on a molar basis, excluding any inert carrier or diluent gases.

The hydrogen-free silicon precursor and the hydrogen-free oxygen source may be supplied to the processing chamber at any suitable flow rate.

In some embodiments, the hydrogen-free oxygen source flowed at a flow rate in a range of about 500 sccm to about 5000 sccm, about 1000 sccm to about 3000 sccm In some embodiments, the hydrogen-free oxygen source flowed at a flow rate of about 1000 sccm, about 2000 sccm or about 3000 sccm.

The plasma gas may be any suitable plasma gas and used to produce any suitable plasma which does not contain hydrogen ions or hydrogen radicals. In some embodiments, the plasma is generated separate from the processing chamber (e.g., a remote plasma). In some embodiments, the plasma is generated within the processing chamber (e.g., a direct plasma). In some embodiments, the plasma gas does not contain hydrogen atoms. In some embodiments, the plasma gas is the hydrogen-free oxygen source. In some embodiments, the plasma gas comprises a noble gas. In some embodiments, the plasma gas comprises one or more of He, Ne or Ar.

In some embodiments, a diluent or carrier gas is also provided with one or more of the hydrogen-free silicon precursor, the hydrogen-free oxygen source, or the plasma gas.

In some embodiments, the temperature of the substrate is maintained at a set temperature during the formation of the low-H silicon dioxide layer. Some embodiments of the disclosure advantageously provide for the formation of the low-H silicon dioxide layer at a relatively low temperature. Stated differently, some embodiments of the disclosure provide for the formation of the low-H silicon dioxide layer at temperatures lower than typically used for the CVD formation of silicon dioxide.

In some embodiments, the substrate is maintained at a temperature of about 540° C., about 400° C., or about 250° C. In some embodiments, the substrate is maintained at a temperature of less than or equal to about 550° C., less than or equal to about 500° C., less than or equal to about 450° C., less than or equal to about 400° C., less than or equal to about 350° C., less than or equal to about 300° C., or less than or equal to about 250° C.

Some embodiments of the disclosure advantageously provide low-H silicon dioxide layers with equivalent or superior properties to silicon dioxide layers formed by other known methods. In some embodiments, the equivalent or superior property is selected from one or more of breakdown voltage ($V_{bd}$), wet etch rate, plasma etch rate, film modulus, delta stress, and film adhesion.

In some embodiments, the properties of the low-H silicon dioxide layer are evaluated against a silicon dioxide layer deposited by a high density plasma method. In some embodiments, the high density plasma method utilizes a plasma with a higher power than the methods described herein for formation of the low-H silicon dioxide layer. In some embodiments, the high density plasma method utilizes water ($H_2O$) as an oxidant. For the avoidance of doubt, high density plasma methods which utilize water are expected to produce layers with higher hydrogen content than low-H silicon dioxide layers described herein.

In some embodiments, the properties of the low-H silicon dioxide layer are evaluated against a silicon dioxide layer deposited by a high temperature CVD method. In some embodiments, the high temperature CVD method utilizes a temperature of greater than or equal to about 550° C. For the avoidance of doubt, the high temperature CVD process does not utilize plasma. As stated above, the lower processing temperatures of some embodiments of the disclosure allows for an increased thermal budget in manufactured devices.

In some embodiments, the low-H silicon dioxide layers formed have superior breakdown voltage. In some embodiments, the breakdown voltage of the low-H silicon dioxide layers formed are greater than the breakdown voltage for a silicon dioxide layer deposited using a high density plasma under similar test conditions. In some embodiments, the breakdown voltage of the low-H silicon dioxide layers formed are greater than the breakdown voltage for a silicon dioxide layer deposited using a using a high-temperature CVD process under similar test conditions. In some embodiments, the low-H silicon dioxide layer has a breakdown voltage ($V_{bd}$) greater than or equal to about 10 MV/cm at $10^{-5}$ A/cm$^2$ for a 200 Å layer.

In some embodiments, the low-H silicon dioxide layers formed have a superior wet etch rate. In some embodiments, the wet etch rate is evaluated as the wet etch rate ratio (WERR) of the subject layer relative to a thermal silicon dioxide layer. In some embodiments, the wet etch rate and WERR of the low-H silicon dioxide layer is lower than a silicon dioxide layer formed by other methods. In some embodiments, the wet etch rate ratio of the low-H silicon dioxide layer to a thermal silicon dioxide layer is in a range of about 1.5 to about 2.5. In some embodiments, when the low-H silicon dioxide layer is deposited at a temperature in a range of about 400° C. to about 550° C., the wet etch rate ratio of the low-H silicon dioxide layer to a thermal silicon dioxide layer is about 1.5.

In some embodiments, provided that they are deposited at about the same temperature, the low-H silicon dioxide layer has a wet etch rate ratio relative to a thermal silicon dioxide layer lower than a silicon dioxide layer deposited using a high density plasma. In some embodiments, provided that they are deposited at a temperature in a range of about 400° C. to about 550° C., the low-H silicon dioxide layer has a wet etch rate ratio relative to a thermal silicon dioxide layer lower than a silicon dioxide layer deposited using a high-temperature CVD process.

In some embodiments, the low-H silicon dioxide layers formed have a superior film modulus. In some embodiments, the film modulus of the low-H silicon dioxide layer is greater than a silicon dioxide layer formed by other methods. In some embodiments, provided that they are deposited at about the same temperature, the low-H silicon dioxide layer has greater film modulus than a silicon dioxide layer deposited using a high density plasma. In some embodiments, provided that they are deposited at a temperature in a range of about 400° C. to about 550° C., the low-H silicon dioxide layer has a greater film modulus than a silicon dioxide layer deposited using a high-temperature CVD process. In some embodiments, the low-H silicon dioxide layer has a film modulus greater than or equal to about 85 GPa.

In some embodiments, the low-H silicon dioxide layers formed have superior delta stress. As used in this regard, delta stress is measured by preforming an anneal process at about 850° C. for 60 minutes. Without being bound by theory, it is believed that lower (more negative) delta stress values are preferable for applications where oxide layers are paired with nitride layers. Nitride layers have a positive delta stress values. Therefore, oxide layers which have less positive, preferably negative, delta stress values are preferable to reduce stack bow after anneal processes. In some embodiments, the low-H silicon dioxide layers have a negative delta stress. In some embodiments, the low-H silicon dioxide layers have a delta stress of less than or equal to about 0 MPa, less than or equal to about −5 MPa, less than or equal to about −10 MPa, less than or equal to about −20 MPa, less than or equal to about −30 MPa, or less than or equal to about −40 MPa.

In some embodiments, provided that they are deposited at a temperature in a range of about 400° C. to about 550° C., the low-H silicon dioxide layer has a delta stress value less than that of a silicon dioxide layer deposited using a high-temperature CVD process.

In some embodiments, the low-H silicon dioxide layers formed have similar plasma etch selectivity to silicon dioxide layers formed by known processes. In some embodiments, the low-H silicon dioxide layer has a $C_4F_6$ plasma etch ratio relative to a silicon dioxide layer deposited using a high-temperature CVD process of less than or equal to about 1.1. In some embodiments, the etch ratio is in a range of about 1 to about 1.1.

In some embodiments, the low-H silicon dioxide layers formed have superior film properties relative to silicon dioxide layers formed by known processes. In some embodiments, the low-H silicon dioxide layers have good adhesion. In some embodiments, the low-H silicon dioxide layers have a smooth surface. In some embodiments, the low-H silicon dioxide layers are homogenous.

Some embodiments of the disclosure advantageously provide methods for tuning the stress profile of a low-H silicon dioxide layer. Without being bound by theory it is believed that lower (more negative) delta stress allows for stacks of nitride-oxide to be annealed with less stack bow due to offsetting delta stress values between the nitride and oxide layers.

The methods of tuning the stress profile comprise forming the low-H silicon dioxide layer as described above. The method further comprises modifying one or more of the flow rate of the hydrogen-free oxygen source or the processing pressure of the processing chamber.

In some embodiments, the flow rate of the hydrogen-free oxygen source is modified to tune the stress profile of the low-H silicon dioxide layer. In some embodiments, the flow rate of the hydrogen-free oxygen source is in a range of about 1000 sccm to about 3000 sccm. In some embodiments, the flow rate of the hydrogen-free oxygen source is about 2000 sccm.

In some embodiments, the processing pressure of the processing chamber is modified to tune the stress profile of the low-H silicon dioxide layer. In some embodiments, the processing pressure is in a range of about 1 Torr to about 10 Torr, or in a range of about 2 Torr to about 8 Torr. In some embodiments, the processing pressure is about 3 Torr or about 7.3 Torr.

In some embodiments, both the flow rate of the hydrogen-free oxygen source and the processing pressure are modified to tune the stress profile of the low-H silicon dioxide layer. For example, a desired stress profile (e.g., negative delta stress) may be obtained while using a lower processing pressure by using an intermediate flow rate, but the same stress profile requires a higher flow rate when the low-H silicon dioxide layer is formed at a higher pressure.

In some embodiments, the stress profile of the low-H silicon dioxide layer may be tuned so that the low-H silicon dioxide layers have a negative delta stress. In some embodiments, the stress profile of the low-H silicon dioxide layer may be tuned so that the low-H silicon dioxide layers have a delta stress of less than or equal to about 0 MPa, less than or equal to about −5 MPa, less than or equal to about −10 MPa, less than or equal to about −20 MPa, less than or equal to about −30 MPa, or less than or equal to about −40 MPa.

Some embodiments of the disclosure advantageously provide a oxide-nitride stack with reduced stack bow. By forming a low-H silicon dioxide layer with a more negative delta stress, the stress profiles of the oxide and nitride layers offset each other and lead to reduced stack bow.

In some embodiments, an oxide-nitride stack comprises alternating layers of silicon nitride and low-H silicon dioxide. The silicon nitride layers having a positive delta stress value and the low-H silicon dioxide layers have a negative delta stress value. In some embodiments, after anneal at about 850° C. for about 60 minutes the oxide-nitride stack shows little to no stack bow.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method of forming a low-H silicon dioxide layer, the method comprising exposing a substrate to a hydrogen-free silicon precursor comprising $Si(NCS)_4$, a hydrogen-free oxygen source, and a plasma to form a low-H silicon dioxide layer, the low-H silicon dioxide layer having less than or equal to about 3 percent hydrogen on an atomic basis.

2. The method of claim 1, wherein the hydrogen-free oxygen source comprises one or more of $O_2$, $O_3$ or $N_2O$.

3. The method of claim 1, wherein the substrate is maintained at a temperature of less than or equal to about 300° C.

4. The method of claim 1, wherein the low-H silicon dioxide layer has less than or equal to about 1 percent hydrogen on an atomic basis.

5. The method of claim 1, wherein a film modulus of the low-H silicon dioxide layer is greater than or equal to about 85 GPa.

6. A method of tuning a stress profile of a low-H silicon dioxide layer having less than or equal to about 3 percent hydrogen on an atomic basis, the method comprising:
exposing a substrate in a processing chamber to a hydrogen-free silicon precursor comprising $Si(NCS)_4$, a hydrogen-free oxygen source, and a plasma to form a low-H silicon dioxide layer; and
modifying one or more of a flow rate of the hydrogen-free oxygen source or a pressure of the processing chamber to tune the stress profile of the low-H silicon dioxide layer during an anneal process.

7. The method of claim 6, wherein the anneal process is performed at a temperature of about 850° C. for about 60 minutes.

8. The method of claim 6, wherein the stress profile of the low-H silicon dioxide layer is tuned to have a delta stress value less than or equal to about 0 MPa.

* * * * *